United States Patent

Ravanelli et al.

[11] Patent Number: 6,072,682
[45] Date of Patent: Jun. 6, 2000

[54] PROTECTION CIRCUIT FOR AN ELECTRIC SUPPLY LINE IN A SEMICONDUCTOR INTEGRATED DEVICE

[75] Inventors: Enrico M. A. Ravanelli, Monza; Luca Fontanella, Milan, both of Italy

[73] Assignee: STMicroelectronics S.r.l., Agrate Brianza, Italy

[21] Appl. No.: 09/001,330

[22] Filed: Dec. 30, 1997

[30] Foreign Application Priority Data

Dec. 31, 1996 [EP] European Pat. Off. ............... 96830664

[51] Int. Cl.[7] ........................................................ H02H 3/22
[52] U.S. Cl. ............................ 361/111; 361/56; 361/91.2; 361/91.5
[58] Field of Search ................................ 361/56, 91, 111, 361/91.1, 91.2, 91.5; 257/355

[56] References Cited

U.S. PATENT DOCUMENTS

| | | | |
|---|---|---|---|
| 5,740,000 | 4/1998 | Stackhouse et al. | 361/56 |
| 5,748,425 | 5/1998 | Gutsch et al. | 361/56 |
| 5,781,388 | 7/1998 | Quigley | 361/56 |

FOREIGN PATENT DOCUMENTS

| | | |
|---|---|---|
| 0 057 024 | 8/1982 | European Pat. Off. . |
| 0 225 586 | 6/1987 | European Pat. Off. . |
| 2494 501 | 5/1982 | France . |

OTHER PUBLICATIONS

Muller and Kamins, *Device Electronics for Integrated Circuits,* 1986, 2d ed., John Wiley & Sons, pp. 10, 96. (No Month).

*Primary Examiner*—Michael J. Sherry
*Attorney, Agent, or Firm*—Theodore E. Galanthay; Robert Iannucci; Seed IP Law Group PLLC

[57] ABSTRACT

A protection circuit for a power supply line in a semiconductor device, comprising first and second field-effect transistors, both transistors having their respective drain terminals connected to the power supply line. The gate source terminals of the first transistor are connected to ground through first and second resistors, respectively. The gate and source terminals of the second transistor are connected to the source terminal of the first transistor and to ground, respectively.

3 Claims, 1 Drawing Sheet

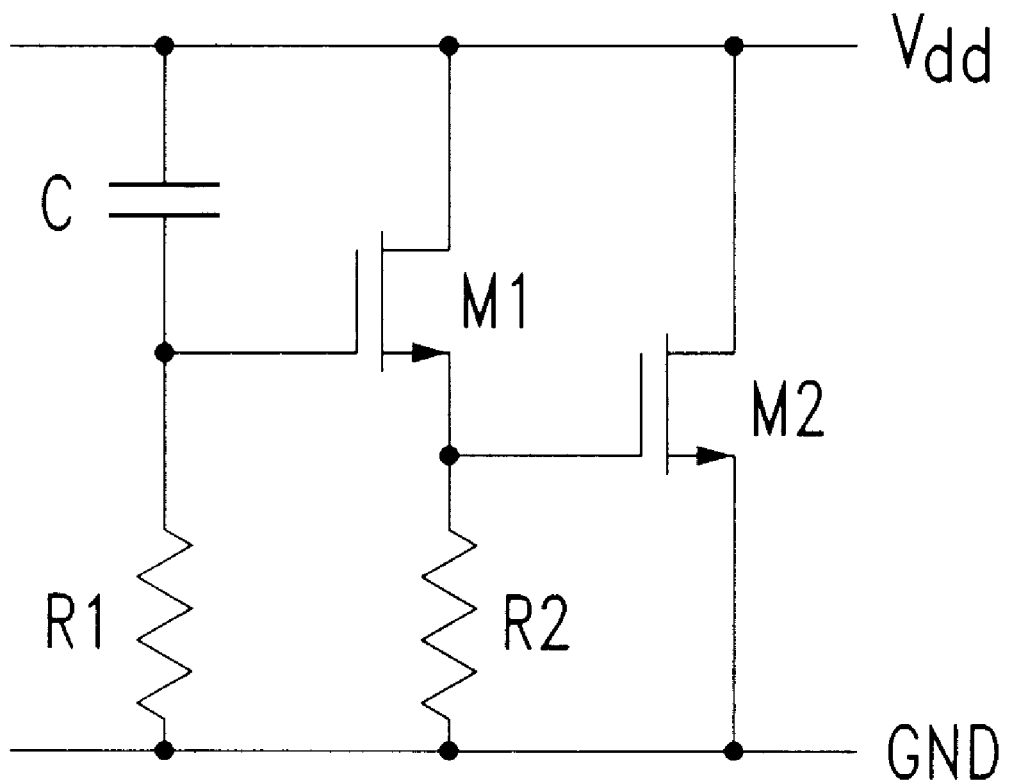

PROTECTION CIRCUIT FOR AN ELECTRIC SUPPLY LINE IN A SEMICONDUCTOR INTEGRATED DEVICE

TECHNICAL FIELD

The present invention relates to protection elements or circuits for the terminals of an integrated circuit in which the protection circuits are incorporated. In particular, it relates to a protection circuit for a power supply terminal or line of an integrated circuit device.

BACKGROUND OF THE INVENTION

MOS technology integrated circuits and the low-voltage supplied portions of devices integrated with mixed-type technologies, such as logic circuits included in such devices, can suffer serious damage from electrostatic discharges (ESD) at their terminals. Malfunction or damage may also result from the application of overvoltages to their supply terminals.

With respect to electrostatic discharges, it is a recognized fact that the terminals of an integrated circuit may incidentally come in contact with electrically charged objects, both during their fabrication and their inclusion in a circuit assembly, or additionally while in operation. When this occurs, potential differences of a substantial magnitude may be established in the integrated circuit device, for example, between the gate electrodes of input transistors or the drain regions of output transistors, and the semiconductor material substrate on which the integrated circuit is formed. In the former case, when the potential difference exceeds the dielectric strength threshold of the gate insulator, the transistor is put out of use by the electrostatic discharge that develops through the insulation. In the latter case, a similar destructive effect occurs when the potential difference exceeds the reverse breakdown threshold of the drain junction. In a CMOS integrated circuit fabricated with 1.2 $\mu$m technology, that is, with a minimum gate dimension of 1.2 $\mu$m, the breakdown voltage is approximately 12 to 14 volts for input transistors, and approximately 12 volts for output transistors.

Several measures have been proposed for protecting the various input, output, and supply terminals from electrostatic discharges. In many cases, protection circuits utilizing bipolar side transistors have been successfully employed.

For example, a known protection circuit suitable for monolithic integration with a CMOS integrated circuit device requiring protection is disclosed in Italian Patent Application No. 26063 A/80 by the Assignee of the present invention. The protection circuit basically comprises of an NPN side transistor whose emitter and collector are doped with impurities of the N-type, similarly and simultaneously with the source and drain regions of the IGFETs of the MOS circuit to be protected, and whose unaccessible base is heavily and deeply doped by ion implantation with impurities of the P-type.

In Italian Patent Application No. 23077 A/85 by the Assignee of the present invention, an improved use of the same structure is disclosed. The improved protection circuit comprises a first and a second bipolar side transistor having their collector terminals respectively connected to the input terminal of the circuit and the gate electrodes of the IGFETs. The first and second transistors have their emitter terminals jointly connected to a ground terminal, and a diffused resistor (R') connecting the collectors of the two side transistors. The width of the first transistor base and the concentration of impurities in the bases of both side transistors are effective to keep the voltage that triggers the appearance of negative resistance in the first side transistor, and the breakdown voltage in the second side transistor, at a value below the breakdown voltage of the gate isolating oxides and below the breakdown voltage of the bipolar junctions contained in the integrated circuit. The transistor base width and concentration of impurities are also effective to keep the sustaining voltage of the first side transistor at a value above the supply voltage to the integrated circuit.

Another known protection circuit that is simple and effective in protecting against electrostatic discharges is a bipolar transistor with its base and emitter shorted together and connected between the terminal to be protected and ground. The transistor would then have a bistable current/voltage characteristic where the transistor has a high impedance, high voltage state, referred to as BVcbo in the art, and a low impedance, low voltage state, referred to as BVcer. The transistor would operate in the first state during normal operation of the circuit, and leave it unconcerned. But on the occurrence of an electrostatic discharge, the transistor would be forced to operate in the second state, thereby providing a way to ground for a discharge pulse.

However, the effectiveness of these circuits that use bipolar transistors dwindles considerably when a supply line or terminal is to be protected. In fact, BVcbo and BVcer may have statistical process variations that result in their effective values being inconsistent with the circuit operation requirements where a line or terminal is at the highest potential provided in the integrated circuit.

Moreover, voltage noise on the supply line or terminal to be protected could inadvertently turn on the bipolar transistor protection circuit and cause the supply voltage to be clamped at BVcer, a value far lower than that intended for powering the circuit. This may result not only in circuit malfunction, but also in permanent damage due to the large current flowing directly through the circuit.

SUMMARY OF THE INVENTION

According to the principles of the present invention, a protection circuit is provided that can be used for protecting a power supply line or terminal in an integrated circuit device from electrostatic discharges.

The protection circuit uses two field effect transistors to couple the power supply line or terminal to a ground line. The first field-effect transistor has its gate connected to ground through one resistor and its source connected to ground through another resistor. The gate of the first field-effect transistor is further capacitively coupled to the power supply line or terminal that is to be protected. The second field-effect transistor has its source connected to ground and its gate connected to the node between the source of the first transistor and the respective resistor. By capacitively coupling the gate of the first field-effect transistor to the power supply line or terminal, the resulting circuit is activated by transient conditions on the power supply line or terminal. The integrated circuit device is protected from damage by providing through the second field-effect transistor a conductive path between the power supply line or terminal and ground to dissipate any electrostatic discharge.

The features and advantages of a protection circuit according to the embodiments of the present invention will be apparent from the following description given by way of non-limitative example with reference to the accompanying drawing.

BRIEF DESCRIPTION OF THE DRAWINGS

The FIGURE is a diagram of a protection circuit according to the invention and intended for a power supply line or terminal of an integrated circuit device.

DETAILED DESCRIPTION OF THE INVENTION

The FIGURE shows a circuit according to an embodiment of the present invention, comprising a first field-effect transistor M1 having its gate and source terminals connected to ground (GND), respectively through first and second resistors, R1 and R2, and its drain terminal connected to the power supply line Vdd to be protected. The protection circuit also includes a second field-effect transistor M2 connected between ground and the supply line through its source and drain terminals, respectively, and having its gate terminal connected to the source terminal of the transistor M1.

Also shown in the FIGURE is a capacitor C connected between the gate terminal and the drain terminal of the transistor M1. For optimum performance, the use of a separate capacitor formed in the same integrated circuit is preferred, but in an alternative embodiment, the capacitor C is the intrinsic capacitor that occurs naturally between the gate and the drain of the transistor M1. Effectiveness of the protection circuit may be obtained by the intrinsic capacitance that exists between the gate and the drain of the transistor M1 itself. The resistors R1 and R2 may be diffused in the substrate or formed as polycrystalline silicon resistors.

A protection circuit according to the invention is a dynamic circuit that is activated only by a transient condition, and reveals no harmful latchup proneness. However, the minimum variation level dV/dt of the supply voltage for activation of the protector should be greater than, $$\frac{2V_{th}}{VC \cdot R1}$$

where Vth is the threshold voltage of transistor M1. Under a condition of DC current, no current will flow through the protection circuit.

All the components of the protection circuit operate in the active zone during the protection function, unlike the aforementioned conventional devices which operate in an avalanche conduction mode. The channel region of the output transistor M2 should be suitably dimensioned to hold the operation of the driver transistor M1 within the triode range. With transistor M1 held within the triode range, the drain-gate voltage of transistor M2 is quite low, and would be held at the fringe of the saturation range. As a result, permanent snapback latchup will not occur for either transistor.

In a preferred embodiment, transistors M1 and M2 are of the VDMOS type. In alternative embodiments, other types of transistors may be used. The use of components of the VDMOS type is highly advantageous in that they will inhibit overcoming the voltages set by the integration process during an electrostatic discharge. Additionally, a protection circuit according to the invention is quite fast, the turn-on time of the VDMOS components being given as, $$L/Vsat$$

where L is the length of the channel, and Vsat is the speed of the saturating electrons. The resulting turn-on time for a VDMOS component having a reasonable channel length is normally much faster than the leading edges of the ESD pulses, thus allowing the protection circuit to effectively suppress all frequency components.

The clamping voltage of the protection circuit is not much higher than the gate-source voltage of transistor M1 in saturation, and accordingly, the protection circuit shows improved effectiveness upon the prior art protection circuits during an electrostatic discharge.

A protection circuit according to this invention is unaffected by process variations in the integration process and satisfies the requirement for high process voltages. When the input voltage, Vdd, exceeds a selected voltage, the protection circuit triggers, turning on transistors M1 and M2 and connecting Vdd to ground, thus protecting the circuits on the chip from any voltage above the triggering voltage. By appropriate dimensioning of the transistors, the triggering voltage can be easily selected to any value between 5 and 60 volts in one embodiment.

In other embodiments, the triggering voltage can be any selected in the range of 1 volt to over 80 volts.

Furthermore, a protection circuit according to the invention is highly effective in protecting the device against damage whenever a voltage greater than the supply rating is applied to the supply line, even if such a condition is continuous.

It should be understood that modifications or substitutions may be made unto the embodiment described hereinabove, in ways known to the skilled ones.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A protected integrated semiconductor circuit capable of being activated in a dynamic circuit activated only by a transient condition, comprising:

a power supply terminal and a ground terminal;

first and second resistive elements;

a first VDMOS transistor having a control terminal, a first terminal, and a second terminal, the control terminal of the first transistor being coupled to the ground terminal through the first resistive element, the first terminal of the first transistor being coupled to the ground terminal through the second resistive element, and the second terminal being coupled to the power supply terminal through a capacitive element; and a second VDMOS transistor having a control terminal, a first terminal, and a second terminal, the control terminal of the second transistor being coupled between the first terminal of the first transistor and the first resistive element, the first terminal of the second transistor being coupled to the ground terminal, and the second terminal of the second transistor being coupled to the power supply terminal, the channel region of the second VDMOS transistor structured to hold the operation of the first VDMOS transistor in a triode range, wherein the second VDMOS transistor is structured to be held at the range of the saturation range while holding the first VDMOS transistor in the triode range.

2. The integrated semiconductor circuit according to claim 1 wherein the first resistive element and the second resistive element are diff used resistors.

3. The integrated semiconductor circuit according to claim 1 wherein the first resistive element and the second resistive element are polycrystalline silicon resistors.

* * * * *

UNITED STATES PATENT AND TRADEMARK OFFICE
CERTIFICATE OF CORRECTION

PATENT NO      : 6,072,682
DATED          : June 6, 2000
INVENTOR(S)    : Enrico M.A. Ravanelli and Luca Fontanella It is certified that error appears in the above-identified patent and that said Letters Patent are hereby corrected as shown below:

In claim 1, line 56, "held at the range" should read --held at the fringe--.

In claim 2, line 60, "element are diff used" should read --element are diffused--.

Signed and Sealed this

Tenth Day of April, 2001

Attest:

NICHOLAS P. GODICI

Attesting Officer

Acting Director of the United States Patent and Trademark Office